(12) United States Patent
Nakamura et al.

(10) Patent No.: US 7,048,866 B2
(45) Date of Patent: May 23, 2006

(54) METAL/CERAMIC BONDING ARTICLE AND METHOD FOR PRODUCING SAME

(75) Inventors: Jynji Nakamura, Shiojiri (JP); Noboru Kamihira, Shiojiri (JP)

(73) Assignee: Dowa Mining Co., Ltd., Tokyo (JP)

( * ) Notice: Subject to any disclaimer, the term of this patent is extended or adjusted under 35 U.S.C. 154(b) by 335 days.

(21) Appl. No.: 10/454,111

(22) Filed: Jun. 3, 2003

(65) Prior Publication Data
US 2003/0224199 A1    Dec. 4, 2003

(30) Foreign Application Priority Data
Jun. 4, 2002    (JP)    ............................ P2002-162381

(51) Int. Cl.
    C23F 4/00    (2006.01)
    H01L 21/027    (2006.01)
(52) U.S. Cl. .............................. 216/13; 216/17; 216/41
(58) Field of Classification Search ................ 428/601, 428/551, 572, 597, 599, 600, 620, 81; 228/123.1, 228/122.1, 174; 361/748, 728, 736; 148/516; 216/41, 13, 17; 205/717, 721
See application file for complete search history.

(56) References Cited

U.S. PATENT DOCUMENTS

| | | | | |
|---|---|---|---|---|
| 4,981,761 A * | 1/1991 | Ookouchi et al. | ........... | 428/594 |
| 5,012,324 A | 4/1991 | Martin et al. | | |
| 5,328,751 A * | 7/1994 | Komorita et al. | ............ | 428/209 |
| 5,818,079 A * | 10/1998 | Noma et al. | ................. | 257/295 |
| 5,986,218 A * | 11/1999 | Muto et al. | .................. | 174/261 |
| 6,054,762 A * | 4/2000 | Sakuraba et al. | ........... | 257/703 |
| 6,426,154 B1 * | 7/2002 | Naba et al. | ................. | 428/620 |
| 6,613,450 B1 * | 9/2003 | Tsukaguchi et al. | ........ | 428/621 |
| 6,686,030 B1 * | 2/2004 | Tsukaguchi et al. | ........ | 428/210 |
| 6,791,180 B1 * | 9/2004 | Kitamura et al. | ............ | 257/701 |
| 6,918,529 B1 * | 7/2005 | Tsukaguchi et al. | ..... | 228/122.1 |
| 2004/0262367 A1 * | 12/2004 | Nakamura | ............... | 228/122.1 |

FOREIGN PATENT DOCUMENTS

| | | |
|---|---|---|
| EP | 40 04 844 | 1/1991 |
| EP | 0 827 198 | 3/1998 |
| EP | 0 935 286 | 8/1999 |
| JP | 01059986 | 3/1989 |
| JP | 01251690 | 10/1989 |

OTHER PUBLICATIONS

Japanese Patent Laid-Open No. 10-326949 (published on May 26, 1997).

* cited by examiner

*Primary Examiner*—Deborah Jones
*Assistant Examiner*—Jason L. Savage
(74) *Attorney, Agent, or Firm*—Bachman & LaPointe, P.C.

(57) ABSTRACT

There is provided a method for producing a metal/ceramic bonding article wherein a metal member 12 is formed so as to have a predetermined shape by printing a resist 14 in a predetermined region on the metal member 12 to etch the metal member 12 after bonding the metal member 12 to a ceramic member 10. In this method, at least one strip-like non-printed portion 16 having a width of, e.g. 0.01 to 0.5 mm, in which the resist is not printed, is provided in a region inwardly spaced from the outer periphery of the resist 14 by a predetermined distance, e.g. 0.01 to 0.5 mm, to control the etch rate in the outer peripheral portion of the metal member 12. Thus, the width and thickness of a fillet is freely changed. For example, a stepped portion (or a stepped portion and fillet) having a width of 0.05 to 0.5 mm and a thickness of 0.005 to 0.25 mm is formed in the outer peripheral portion of the metal member 12.

8 Claims, 6 Drawing Sheets

FIG. 8

METAL/CERAMIC BONDING ARTICLE AND METHOD FOR PRODUCING SAME

BACKGROUND OF THE INVENTION

1. Field of the Invention

The present invention generally relates to a metal/ceramic bonding article having a ceramic substrate and a metal plate bonded to the ceramic substrate, a method for producing the same, a metal/ceramic bonding substrate using the metal/ceramic bonding article, and a power module assembled by using the metal/ceramic bonding article. More specifically, the invention relates to a metal/ceramic bonding article wherein it is difficult to produce cracks in a ceramic member even if thermal shocks are repeatedly applied thereto, a method for producing the same, a metal/ceramic bonding substrate using the metal/ceramic bonding article, and a power module assembled by using the metal/ceramic bonding article.

2. Description of the Prior Art

In a metal/ceramic bonding article used as an insulating substrate, cracks are easily produced in a ceramic member by thermal stress due to differential thermal expansion which is caused between the ceramic member and a metal member by thermal shocks after bonding. As a method for relaxing such thermal stress, there is known a method for decreasing the thickness of the peripheral portion of a metal member, i.e., a method for forming a stepped structure or fillet in the peripheral portion of a metal member.

In order to realize such a structure, there is proposed a method for forming a fillet by utilizing the difference in etch rate between a brazing filler metal and a metal member, the brazing filler metal including silver as a matrix for bonding a metal member to a ceramic member (see Japanese Patent Laid-Open No. 10-326949).

However, in this method, it is difficult to control the dimension of the stepped portion and/or fillet. That is, it is difficult to freely change the width and thickness of the stepped portion and/or fillet, and it is difficult to provide a metal/ceramic bonding article which is higher reliable with respect to repeated heat cycles.

SUMMARY OF THE INVENTION

It is therefore an object of the present invention to eliminate the aforementioned problems and to provide a metal/ceramic bonding article wherein the width and thickness of its stepped portion and/or fillet can be freely changed and which is higher reliable with respect to repeated heat cycles, and a method for producing the same.

It is another object of the present invention to provide a metal/ceramic bonding substrate using the metal/ceramic bonding article, and a power module assembled by using the metal/ceramic bonding article.

In order to accomplish the aforementioned and other objects, the inventors have diligently studied and found that it is possible to provide a method for producing a metal/ceramic bonding article, which can freely change the width and thickness of a stepped portion and/or fillet (for example, which can form a stepped portion (or a stepped portion and fillet) having a width of 0.05 to 0.5 mm and a thickness of 0.005 to 0.25 mm in the outer peripheral portion of a metal member) and which is higher reliable with respect to repeated heat cycles, by controlling the etch rate in the outer peripheral portion of the metal member by providing a strip-like portion having a width of, e.g. 0.01 to 0.5 mm, in which no resist is formed, in a region inwardly spaced from the outer periphery of the resist by a predetermined distance (e.g. 0.01 to 0.5 mm), in a method for producing a metal/ceramic bonding article wherein a-metal member is formed so as to have a predetermined shape by printing a resist in a predetermined region on the metal member to etch the metal member after bonding the metal member to a ceramic member.

According to one aspect of the present invention, there is provided a method for producing a metal/ceramic bonding article, the method comprising the steps of: bonding a metal member to a ceramic member; forming a resist in a predetermined region on the metal member; and etching the metal member so that the metal member has a predetermined shape, wherein at least one non-formed portion, on which the resist is not formed, is provided in a region inwardly spaced from an outer periphery of the resist by a predetermined distance.

In this method for producing a metal/ceramic bonding article, the non-formed portion is preferably at least one strip-like portion extending along the outer periphery of the resist. The predetermined distance is preferably in the range of from 0.01 to 0.5 mm, and the non-formed portion is preferably at least one strip-like portion having a width of 0.01 to 0.5 mm. The non-formed portion may extend along all or part of the outer periphery of the resist. The metal member may be bonded to the ceramic member directly or via an active metal containing brazing filler metal. When the metal member is bonded directly to the ceramic member, a stepped portion having a width of 0.05 to 0.5 mm and a thickness of 0.005 to 0.25 mm is preferably formed in an outer peripheral portion of the metal member at the etching step. When the metal member is bonded to the ceramic member via the active metal containing brazing filler metal, a stepped portion of the metal member and a fillet of the active metal containing brazing filler metal are preferably simultaneously formed in an outer peripheral portion of the metal member at the etching step. In this case, a stepped portion and fillet having a width of 0.05 to 0.5 mm and a thickness of 0.005 to 0.25 mm may be formed in an outer peripheral portion of the metal member at the etching step.

According to another aspect of the present invention, a metal/ceramic bonding article comprises: a ceramic member; a metal member bonded to the ceramic member directly or via a brazing filler metal; and a stepped portion or stepped portion and fillet which has a width of 0.3 mm or more and which is formed in a peripheral portion of the metal member, the metal/ceramic bonding article having a bending strength of 200 MPa or more, the bending strength being measured on measurement conditions of a load speed of 0.5 mm/min and a span length of 30 mm, after a treatment for cooling the metal/ceramic bonding article after heating the metal/ceramic bonding article at 370° C. in a reducing atmosphere for 10 minutes is carried out three times.

According to a further aspect of the present invention, a metal/ceramic bonding substrate comprises the above described metal/ceramic bonding article.

According to a still further aspect of the present invention, a power module is assembled by using the above described metal/ceramic bonding article.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a method for producing a metal/ceramic bonding article according to the present invention will be described below.

Figure 1:
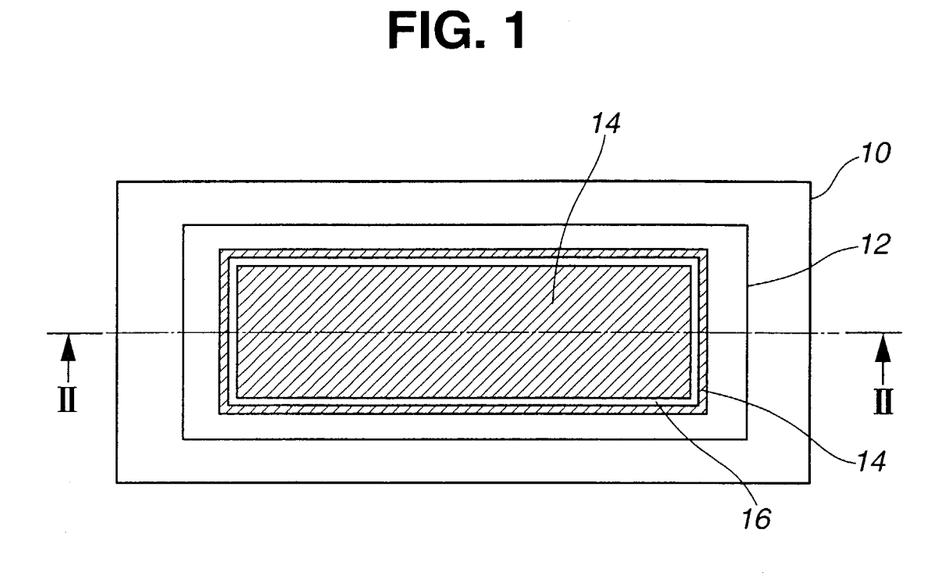
FIG. 1 is a plan view showing a preferred embodiment of a method for producing a metal/ceramic bonding article according to the present invention.
Figure 2:
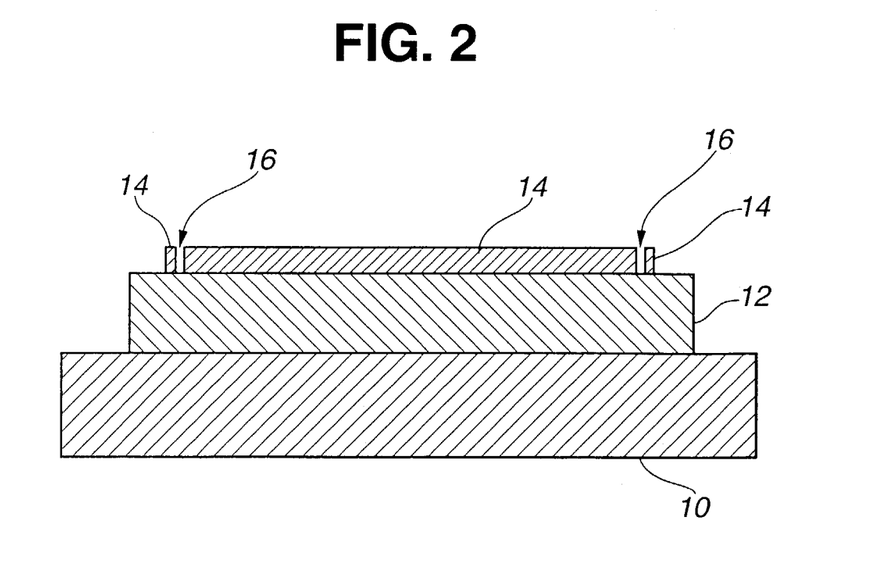
FIG. 2 is a sectional view taken along line II—II of FIG. 1, which shows a preferred embodiment of a method for producing a metal/ceramic bonding article according to the present invention.
Figure 3:
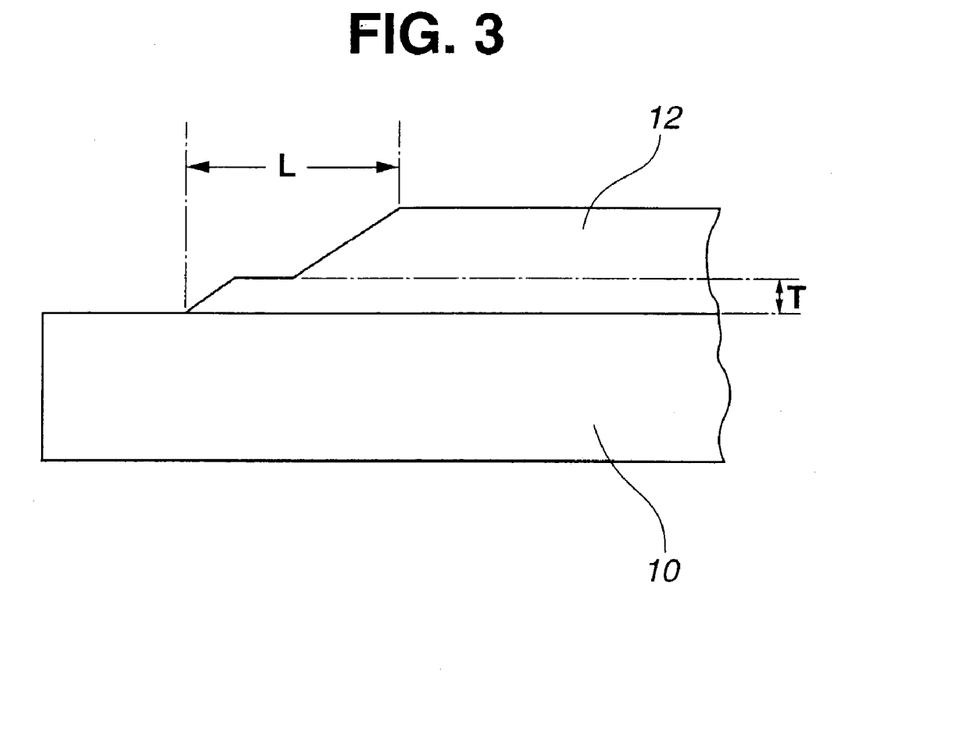
FIG. 3 is an enlarged sectional view showing a peripheral portion of a metal/ceramic bonding article which is produced by bonding a metal member directly to a ceramic member by a preferred embodiment of a method for producing a metal/ceramic bonding article according to the present invention.
Figure 4:
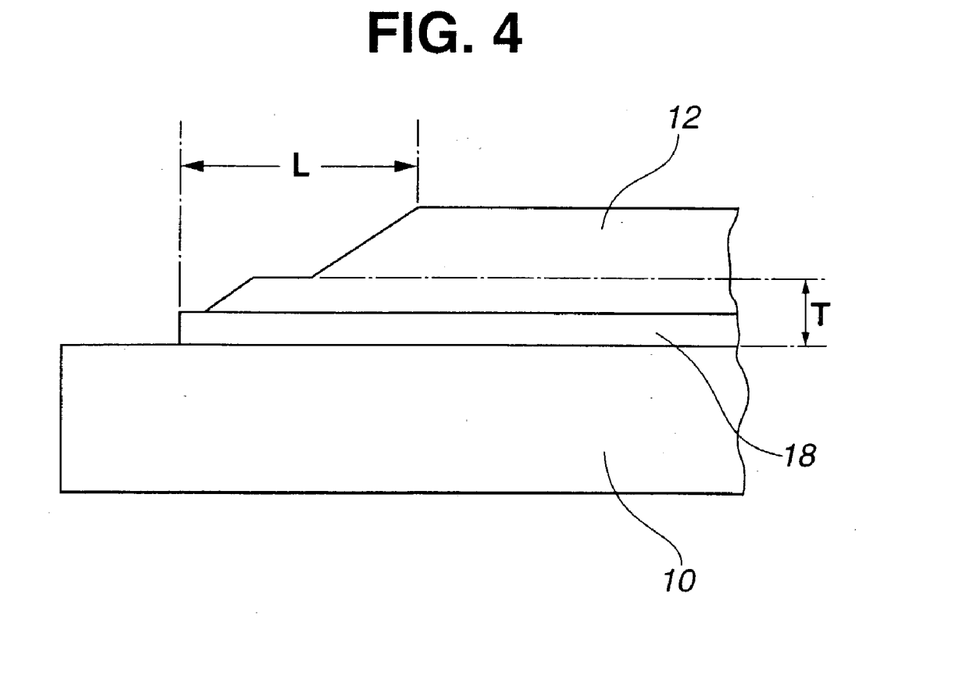
FIG. 4 is an enlarged sectional view showing a peripheral portion of a metal/ceramic bonding article which is produced by bonding a metal member to a ceramic member via an active metal containing brazing filler metal by a preferred embodiment of a method for producing a metal/ceramic bonding article according to the present invention.

As shown in FIGS. 1 and 2, a metal member (e.g. a metal plate) 12 is arranged on a ceramic member (e.g. a ceramic substrate) 10 directly or via an active metal containing brazing filter metal (which is shown by a reference number 18 in FIG. 4) to be bonded thereto by heating. In a predetermined region (e.g. a circuit forming region) on the metal plate 12 thus bonded by heating, a resist 14 is formed by the screen printing or the like. In this screen printing, the resist 14 is printed so as to allow a non-printed portion (a portion in which the resist 14 is not printed) 16 having a predetermined width to extend along the outer periphery of the resist 14 in a region spaced from the outer periphery of the resist 14 by a predetermined distance. Furthermore, the resist 14 may be formed by a dry film, a dip, a spin coater, a roll coater or the like, other than the screen printing. Then, if the resist 14 is removed after an undesired portion of the metal plate 12 is removed by etching, a stepped portion (or a stepped portion and fillet) having a predetermined width (a stepped portion width L) and a predetermined thickness (stepped portion thickness T) is formed in the outer peripheral portion of the metal plate 12 as shown in FIGS. 3 and 4. Thereafter, an electroless nickel plating is carried out on the metal plate 12 (or the metal plate 12 and the active metal containing brazing filler metal 18).

As described above, in the preferred embodiment of a method for producing a metal/ceramic bonding article according to the present invention, the metal member is arranged on the ceramic member directly or via the active metal containing brazing filler metal to be heated in a substantially vacuum or non-oxidizing atmosphere to be cooled to be bonded to the ceramic member. Thereafter, the resist including the non-printed portion which has a predetermined width (0.01 to 0.5 mm) and which extends along all or part of the outer periphery in a region inwardly spaced from the outer periphery by a predetermined distance (0.01 to 0.5 mm) is printed in a predetermined region on the metal member, so that it is possible to control the etch rate to form a metal circuit, which has a stepped portion (or a stepped portion and fillet) having a predetermined width (0.01 to 0.5 mm) and a predetermined thickness (0.005 to 0.25 mm), in the outer peripheral portion of the metal member. Moreover, if two or more printed and non-printed portions of the resist are alternately formed, the width of the stepped portion (or the stepped portion and fillet) can be increased.

The reasons why the width of the stepped portion (or the stepped portion and fillet) is set to be in the range of from 0.01 to 0.5 mm are that cracks are produced by heat cycles repeated less than a hundred times if the width of the stepped portion (or the stepped portion and fillet) is less than 0.01 mm and that the fine patterning of the circuit is obstructed if the width of the stepped portion (or the stepped portion and fillet) is greater than 0.5 mm. Furthermore, if the width of the stepped portion (or the stepped portion and fillet) is 0.3 mm or more, the strength and crack characteristics against furnace passing treatment are particularly high. Thus, the article can be applied to the field of, e.g. vehicles, particularly requiring high reliability, and it is remarkably possible to prevent cracks from being produced by repeated heat cycles.

The reasons why the thickness of the stepped portion (or the stepped portion or fillet) is set to be in the range of from 0.005 to 0.25 mm are that there is some possibility that the portion is broken by heat cycles to lose its stress relaxation effects to deteriorate its reliability if the thickness if less than 0.005 mm, and that there is some possibility that stress is increased to deteriorate its reliability if the thickness is greater than 0.25 mm.

As the ceramic member, there may be used a ceramic member of an oxide, such as alumina or silica, or a non-oxide, such as aluminum nitride or silicon nitride. Usually, there is used a ceramic member having a length of 10 to 300 mm on a side and a thickness of 0.25 to 3.0 mm. At the metal member, there may be used a foil or plate member of a metal, such as copper, aluminum or nickel, or a foil or plate member of an alloy, such as manganin, brass or stainless. A foil or plate member having a thickness of 0.1 to 5.0 mm is often used. However, according to the present invention, the size and thickness of the ceramic member and metal member should not be limited thereto.

The metal/ceramic bonding article according to the present invention may be particularly advantageous to the use of a metal/ceramic bonding substrate for an electronic circuit. If this bonding substrate is used for preparing a power module, the improvement of the reliability of the bonding substrate improves the reliability of the power module, so that it is possible to provide a high reliable power module.

Examples of metal/ceramic bonding articles and methods for producing the same according to the present invention will be described below in detail.

EXAMPLE 1

Copper foils having a thickness of 0.3 mm were arranged on both sides of an alumina substrate having a size of 60 mm×60 mm and a thickness of 0.635 mm, to be heated in a nitrogen atmosphere to be bonded directly to the alumina substrate.

Then, after the surface of the copper foils was polished by an abrasive paper, a circuit forming resist was printed in a circuit forming region on one of the copper foils by the screen printing. In this screen printing, the resist was printed so as to allow a non-printed portion having a width of 0.2 mm (a portion in which the resist was not printed) to extend along the whole outer periphery of the resist in a region inwardly spaced from the outer periphery of the resist by 0.2 mm. Then, the substrate on which a circuit was printed was etched with a cupric chloride etchant to form a copper circuit having a stepped portion having a width of 0.2 mm and a thickness of 0.1 mm on the outer peripheral portion thereof. Moreover, after the resist was removed, nickel was deposited on the copper circuit by the electroless nickel plating so as to have a thickness of 3 μm, so that a final product was obtained.

With respect to the substrate thus obtained, a heat cycle (room temperature→−40° C.×30 minutes→room temperature×10 minutes 125° C.×30 minutes→room temperature× 10 minutes) was carried out three hundreds times. After this treatment, the copper circuit was removed to observe the surface of the alumina substrate by a microscope. As a result, no cracks were produced in the alumina substrate, and the effects of the stepped structure of the outer peripheral portion of the copper circuit were obtained.

EXAMPLE 2

An aluminum nitride substrate having a size of 50 mm×30 mm and a thickness of 0.635 mm was prepared. Then, via an active metal containing silver braze paste, a copper foil having a thickness of 0.3 mm was arranged on the surface of the aluminum nitride substrate, and a copper foil having a thickness of 0.15 mm was arranged on the reverse of the aluminum nitride substrate. Then, the copper foils and the aluminum nitride substrate were heated at 850° C. at a pressure of $10^{-5}$ torr or less to be bonded to each other.

Then, a circuit forming resist was printed in a circuit forming region on one of the copper foils by the screen printing. In this screen printing, the resist was printed so as to allow a non-printed portion having a width of 0.3 mm (a portion in which the resist was not printed) to extend along the whole outer periphery of the resist in a region inwardly spaced from the outer periphery of the resist by 0.25 mm. Then, the substrate on which a circuit was printed was etched with a cupric chloride etchant to form a copper circuit having a stepped portion and fillet having a width of 0.4 mm and a thickness of 0.05 mm on the outer peripheral portion thereof. Moreover, after the resist was removed, nickel was deposited on the copper circuit by the electroless nickel plating so as to have a thickness of 3 μm, so that a final product was obtained.

With respect to the substrate thus obtained, the same heat cycle as that in Example 1 was carried out five hundreds times. After this treatment, the copper circuit and the silver braze were removed to observe the surface of the alumina nitride substrate by a microscope. As a result, no cracks were produced in the aluminum nitride substrate, and the effects of the stepped structure of the outer peripheral portion of the copper circuit were obtained.

COMPARATIVE EXAMPLE 1

An aluminum nitride substrate having a size of 50 mm×30 mm and a thickness of 0.635 mm was prepared, and copper foils having a thickness of 0.3 mm were arranged on both sides thereof via an active metal containing silver braze. Then, the copper foils and the aluminum nitride substrate were heated at 850° C. at a pressure of $10^{-5}$ torr or less to be bonded to each other.

In order to form a circuit on the substrate thus bonded by heating, a resist was printed in a circuit forming region on one of the copper foils. Then, the substrate on which the circuit was printed was etched with a cupric chloride etchant to forma copper circuit having no stepped portion in the outer peripheral portion thereof.

With respect to the substrate thus obtained, the same heat cycle as that in Example 1 was carried out five hundreds times. After this treatment, the copper circuit and the silver braze were removed to observe the surface of the alumina nitride substrate by a microscope. As a result, cracks extending along the copper circuit formed on the aluminum nitride substrate were observed by the naked eye.

EXAMPLES 3 TO 6, COMPARATIVE EXAMPLE 2

A copper circuit was formed on a substrate by the same method as that in Example 1, except that copper foils having a thickness of 0.25 mm were used and that the distance between the outer periphery of a resist and a non-printed portion (the width of an outer peripheral printed portion) and the width of the non-printed portion were changed.

As shown in Table 1, in Example 3, the width of an outer peripheral printed portion was set to be 100 μm, and the width of a non-printed portion was set to be 60 μm, so that a copper circuit having a stepped portion width of 120 μm was formed. In Example 4, the width of an outer peripheral printed portion was set to be 100 μm, and the width of a non-printed portion was set to be 50 μm, so that a copper circuit having a stepped portion width of 200 μm was formed. In Example 5, the width of an outer peripheral printed portion was set to be 100 μm, and the width of a non-printed portion was set to be 90 μm, so that a copper circuit having a stepped portion width of 300 μm and a stepped portion thickness of 60 μm was formed. In Example 6, the width of an outer peripheral printed portion was set to be 150 μm, and the width of anon-printed portion was set to be 120 μm, so that a copper circuit having a stepped portion width of 350 μm and a stepped portion thickness of 30 μm was formed. In Comparative Example 2, non-printed portions were not provided, and a copper circuit having no stepped portions was formed in the outer peripheral portion thereof.

TABLE 1

| | Resist Design (μm) | | Dimension of Stepped Portion (μm) | |
|---|---|---|---|---|
| | Width of Outer Peripheral Portion | Width of Non-Printed Portion | Width | Thickness |
| Example 3 | 100 | 60 | 120 | — |
| Example 4 | 100 | 50 | 200 | — |
| Example 5 | 100 | 90 | 300 | 60 |
| Example 6 | 150 | 120 | 350 | 30 |
| Comp. 2 | — | — | — | — |

With respect to the substrates thus obtained in Examples 3 through 6, a furnace passing treatment (which is a treatment for cooling each substrate after heating it at 370° C. for 10 minutes under a reducing atmosphere (nitrogen 4+hydrogen 1), temperature rising/lowering rate: about 20° C./min) was carried out. Then, the reliability of each substrate was evaluated by bending strengths (MPa) and bending quantities (mm) before the furnace passing treatment, after three-time furnace passing treatments and after six-time furnace passing treatments, and by furnace passing resistances (the number of furnace passing treatments when cracks were produced after it was inspected by appearance whether cracks were produced in the ceramic portion after each furnace passing treatment). The bending strength was measured by the three-point bending test on measuring conditions (load speed: 0.5 mm/min, span length: 30 mm) by means of a bending strength measuring apparatus (SHIMADZUAGS-100D produced by Shimadzu Corp.). In this measurement, a load was applied from the opposite side to the copper circuit. The bending quantity is a displacement when cracks are produced in the ceramic substrate in the three-point bending test.

Tables 2 and 3 show mean values of bending strengths (MPa) before the furnace passing treatment, after three-time furnace passing treatments and after six-time furnace passing treatments, ratios of bending strengths (MPa) after three and six-time furnace passing treatments to those before the furnace passing treatment, mean values of bending quantities (mm), ratios of bending quantities (mm) after three-time and six-time furnace passing treatments to those before the furnace passing treatment, and the numbers of substrates in which cracks were produced after ten-time to fifty-time furnace passing treatments. In Table 3, cracks were produced by less than ten-time furnace passing treatments in Comparative Example 2. From these tables, it was found that a reliable substrate was obtained when the stepped portion width was 300 μm or more, and that a higher reliable substrate was obtained when the stepped portion width was 350 μm or more.

TABLE 2

| | Furnace Passing Treatment | Bending Strength (MPa) | | Bending Quantity (mm) | |
|---|---|---|---|---|---|
| | | Mean | Ratio | Mean | Ratio |
| Example 3 | Before | 435 | — | 0.200 | — |
| | Three Times | 170 | 39.1 | 0.075 | 37.5 |
| | Six Times | 117 | 26.9 | 0.056 | 28.0 |
| Example 4 | Before | 425 | — | 0.191 | — |
| | Three Times | 189 | 44.5 | 0.083 | 43.5 |
| | Six Times | 133 | 31.3 | 0.062 | 32.5 |

TABLE 2-continued

| | Furnace Passing Treatment | Bending Strength (MPa) | | Bending Quantity (mm) | |
|---|---|---|---|---|---|
| | | Mean | Ratio | Mean | Ratio |
| Example 5 | Before | 460 | — | 0.215 | — |
| | Three Times | 264 | 57.4 | 0.125 | 58.1 |
| | Six Times | 251 | 54.6 | 0.110 | 51.2 |
| Example 6 | Before | 467 | — | 0.221 | — |
| | Three Times | 357 | 76.4 | 0.162 | 73.3 |
| | Six Times | 312 | 66.8 | 0.141 | 63.8 |
| Comp. 2 | Before | 380 | — | 0.172 | — |
| | Three Times | 185 | 48.7 | 0.075 | |
| | Six Times | | | | |

TABLE 3

| | Number of Furnace Passing Treatment | | | | | | | | |
|---|---|---|---|---|---|---|---|---|---|
| | 10 | 15 | 20 | 25 | 30 | 35 | 40 | 45 | 50 |
| Example 3 | 0 | 2 | 3 | — | — | — | — | — | — |
| Example 4 | 0 | 4 | 1 | — | — | — | — | — | — |
| Example 5 | 0 | 0 | 0 | 1 | 1 | 0 | 0 | 0 | 0 |
| Example 6 | 0 | 0 | 0 | 0 | 0 | 0 | 0 | 0 | 0 |
| Comp. 2 | — | — | — | — | — | — | — | — | — |

Figure 5:
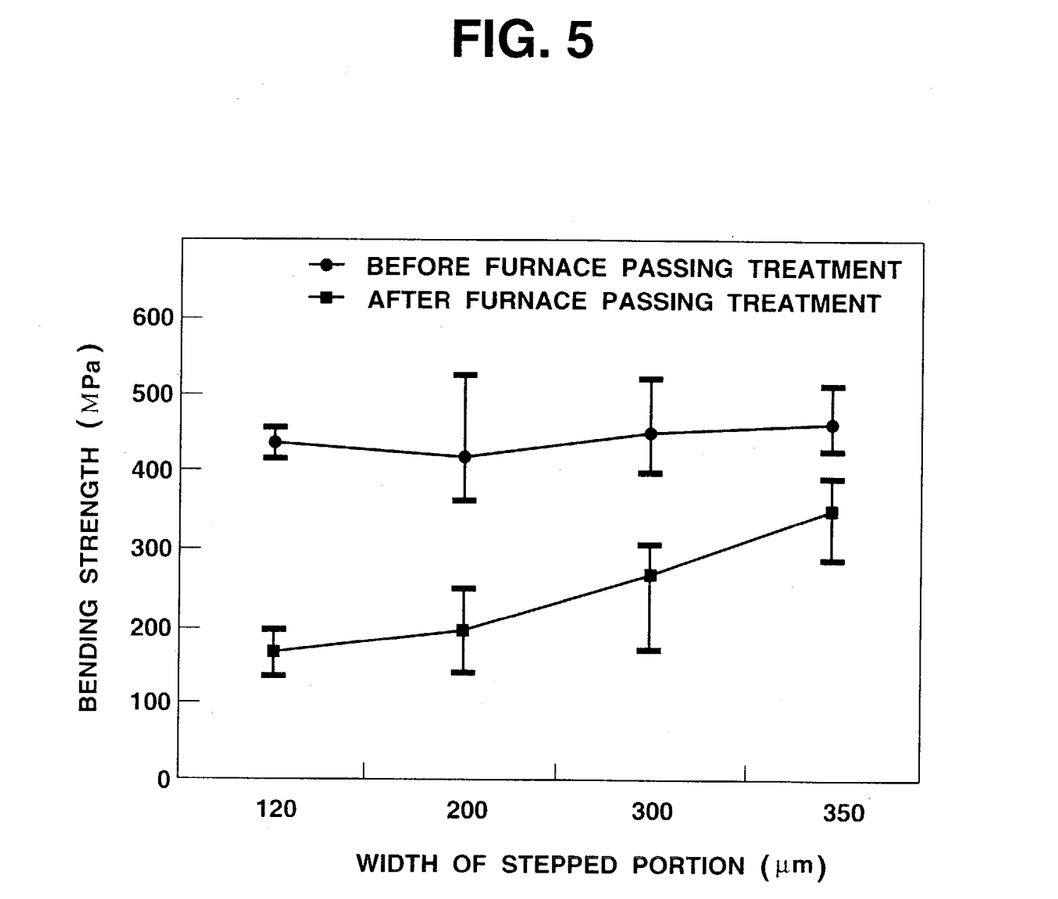
FIG. 5 is a graph showing the relationship between a stepped portion width (μm) and a bending strength (MPa) before a furnace passing treatment and after three-time furnace passing treatments with respect to substrates in Examples 3 through 6.
Figure 6:
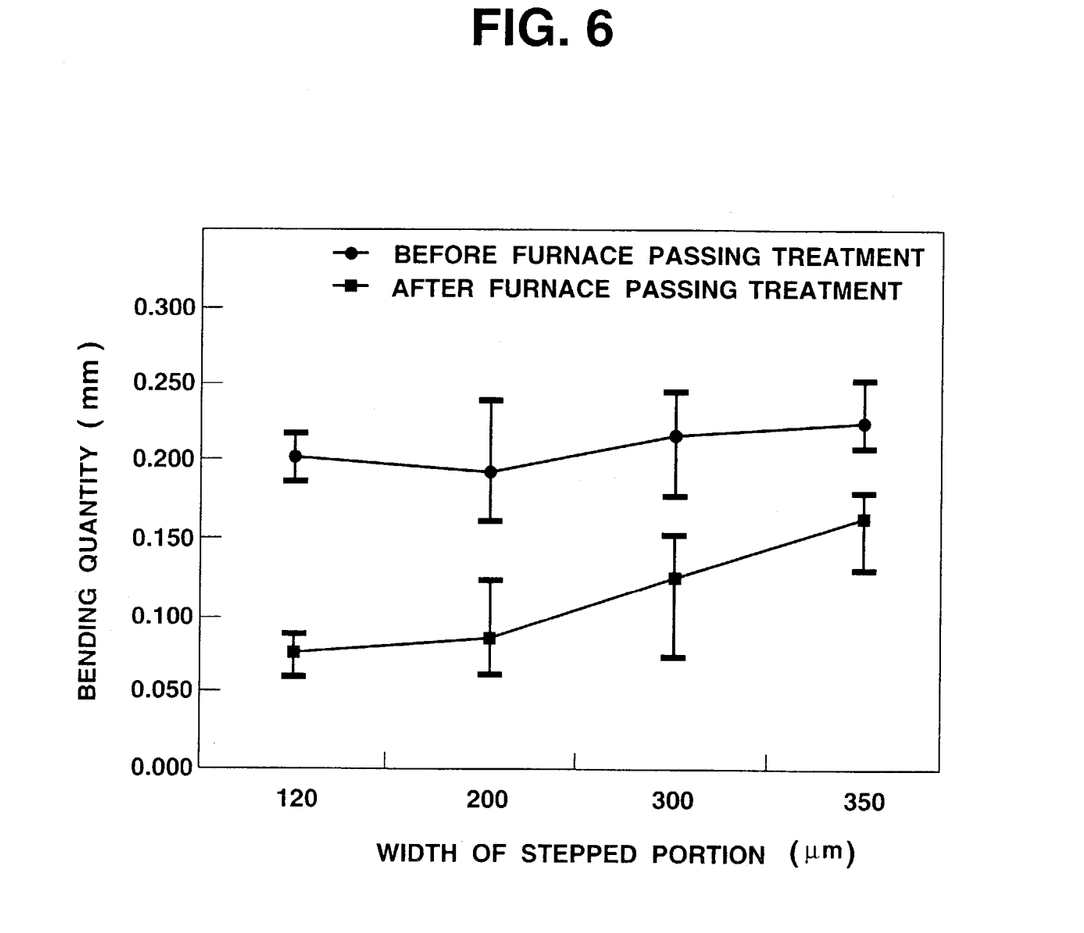
FIG. 6 is a graph showing the relationship between a stepped portion width (μm) and a bending quantity (mm) before a furnace passing treatment and after three-time furnace passing treatments with respect to substrates in Example 3 through 6.

With respect to the substrates in Examples 3 through 6, the relationship between the stepped portion width (μm) and the bending strength (MPa) and the relationship between the stepped portion width (μm) and the bending quantity (mm) before the furnace passing treatment and after three-time furnace passing treatments are shown in FIGS. 5 and 6, respectively. From these figures, it can be seen that a reliable substrate can be obtained if its stepped portion width is 300 μm or more, and that a higher reliable substrate can be obtained if its stepped portion width is 350 μm or more.

Figure 7:
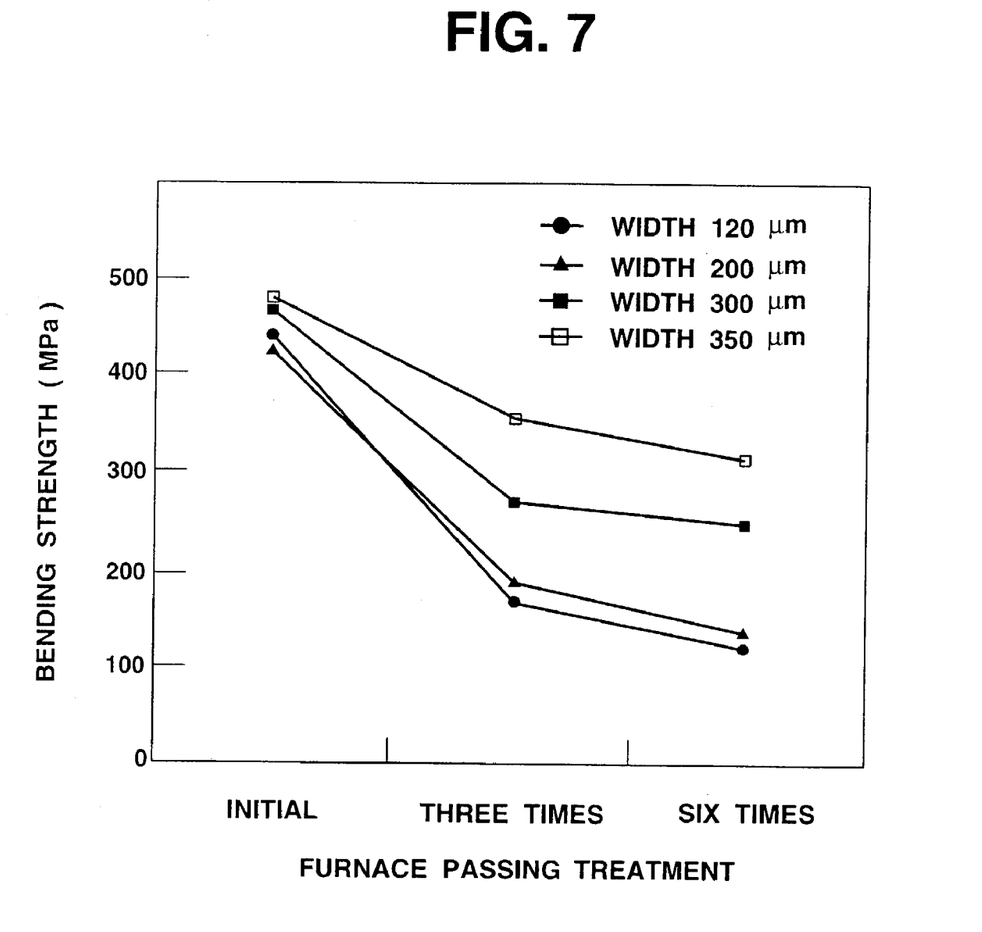
FIG. 7 is a graph showing the relationship between the number of furnace passing treatments and a bending strength (MPa) with respect to substrates in Examples 3 through 6.
Figure 8:
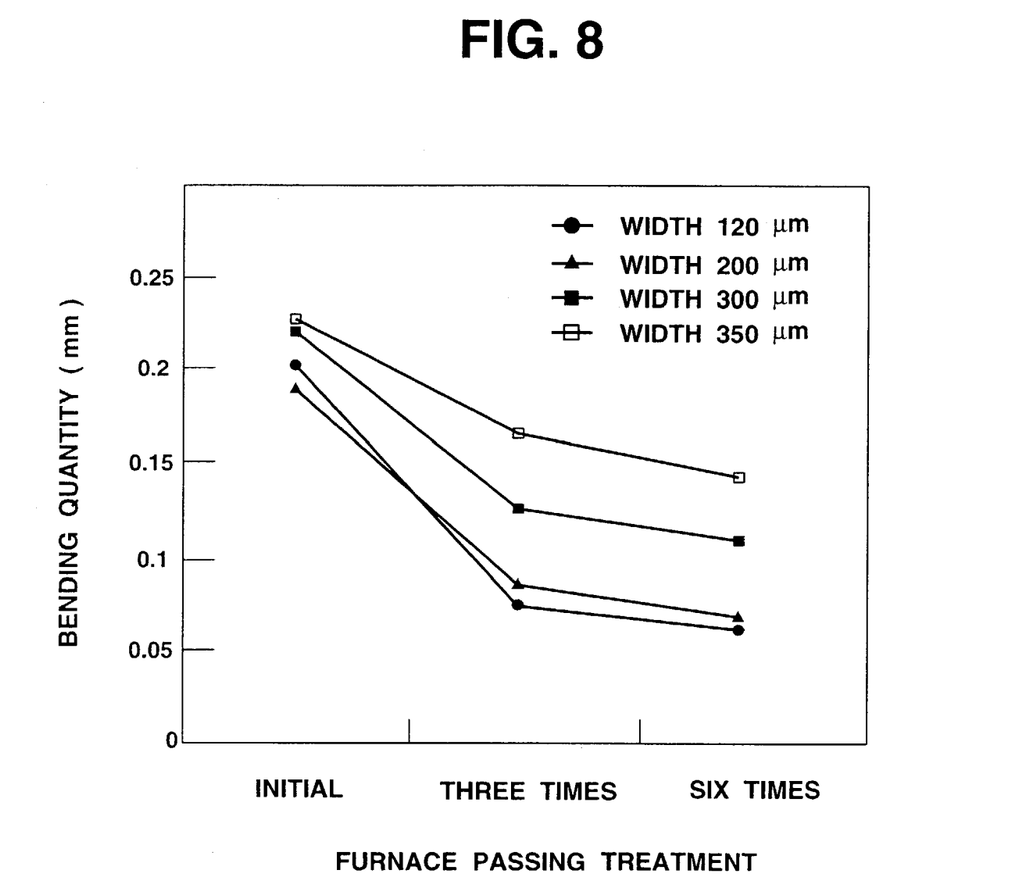
FIG. 8 is a graph showing the relationship between the number of furnace passing treatments and a bending quantity (mm) with respect to substrates in Examples 3 through 6.

With respect to the substrates in Examples 3 through 6, the relationship between the number of furnace passing treatments and the bending strength (MPa) and the relationship between the number of furnace passing treatments and the bending quantity (mm) are shown in FIGS. 7 and 8, respectively. Also from these figures, it can be seen that a reliable substrate can be obtained if its stepped portion width is 300 μm, and that a higher reliable substrate can be obtained if its stepped portion width is 350 μm.

EXAMPLES 7 AND 8

A copper circuit was formed on a substrate by the same method as that in Example 2, except that the distance between the outer periphery of a resist and a non-printed portion (the width of an outer peripheral printed portion) and the width of the non-printed portion were changed.

As shown in Tables 4 and 5, in Example 7, the width of an outer peripheral printed portion was set to be 130 μm, and the width of a non-printed portion was set to be 90 μm, so that a copper circuit having a stepped portion width of 300 μm and a stepped portion thickness of 60 μm was formed on each of three substrates (substrates A, B and C). In Example 8, the width of an outer peripheral printed portion was set to be 150 μm, and the width of anon-printed portion was set to be 120 μm, so that a copper circuit having a stepped portion width 350 Imanda stepped portion thickness of 30 μm was formed on each of three substrates (substrates D, E and F).

With respect to the substrates thus obtained in Examples 7 and 8, after furnace passing treatments were carried out fifty times, the copper circuit and silver braze were removed to observe the surface of each substrate by a microscope. As a result, as shown in Tables 4 and 5, the mean value of crack rates (=(total of lengths of cracks produced after fifty-time furnace passing treatments/overall length of circuit pattern)× 100) was 7.2% in Example 7 and 11.4% in Example 8, so that it can be seen that the rate of occurrence of cracks is very small if the stepped portion width is 350 μm.

TABLE 4

|  | Resist Design Value | | Stepped Portion Width | Stepped Portion Thickness |
| --- | --- | --- | --- | --- |
|  | Peripheral Portion | Non-printed Portion | | |
| Ex. 7 | 130 | 90 | 300 | 60 |
| Ex. 8 | 150 | 120 | 350 | 30 |

TABLE 5

|  |  | Length (mm) | | Crack Rate (%) | |
| --- | --- | --- | --- | --- | --- |
|  | Substrate | Overall Pattern | Crack | Data | Mean |
| Ex. 7 | A | 336 | 320 | 95.3 | |
|  | B | 336 | 290 | 86.2 | 87.2 |
|  | C | 336 | 269 | 80.2 | |
| Ex. 8 | D | 336 | 31 | 9.4 | |
|  | E | 336 | 59 | 17.6 | 11.4 |
|  | F | 336 | 25 | 7.4 | |

As described above, according to the present invention, in a method for producing a metal/ceramic bonding article wherein a metal member is formed so as to have a predetermined shape by printing a resist in a predetermined region on the metal member to etch the metal member after the metal member is bonded to a ceramic member, at least one strip-like portion having a width of, e.g. 0.01 to 0.5 mm, on which the resist is not printed, is provided in a region inwardly spaced from all or part of the outer periphery of the resist by a predetermined distance, e.g. 0.01 to 0.5 mm, to control the etch rate in the outer peripheral portion of the metal member. Thus, it is possible to freely change the width and thickness of a stepped portion and/or fillet. For example, a stepped portion (or a stepped portion and fillet) having a width of 0.05 to 0.5 mm and a thickness of 0.005 to 0.25 mm can be formed in the outer peripheral portion of the metal member, so that it is possible to prevent cracks from being produced by repeated heat cycles.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a metal/ceramic bonding article, said method comprising the steps of:
    bonding a metal member to a ceramic member;
    forming a resist on the metal member so that the resist has at least one non-formed portion in which the resist is not formed and which extends along an outer periphery of the resist in a region inwardly spaced from the outer periphery of the resist; and
    etching an outer peripheral portion of the metal member, wherein at said etching step, said non-formed portion controls an etch rate in the outer peripheral portion of the metal member to form a stepped portion in the outer peripheral portion of the metal member.

2. A method for producing a metal/ceramic bonding article as set forth in claim 1, wherein said region is spaced from the outer periphery of the resist by 0.01 to 0.5 mm, and said non-formed portion has a width of 0.01 to 0.5 mm.

3. A method for producing a metal/ceramic bonding article as set forth in claim 1, wherein said non-formed portion extends along all or part of the outer periphery of said resist.

4. A method for producing a metal/ceramic bonding article as set forth in claim 1, wherein said metal member is bonded directly to said ceramic member.

5. A method for producing a metal/ceramic bonding article as set forth in claim 4, wherein said stepped portion has a width of 0.05 to 0.5 mm and a thickness of 0.005 to 0.25 mm.

6. A method for producing a metal/ceramic bonding article as set forth in claim 1, wherein said metal member is bonded to said ceramic member via an active metal containing brazing filler metal.

7. A method for producing a metal/ceramic bonding article as set forth in claim 6, wherein said stepped portion of said metal member and a fillet of said active metal containing brazing filler metal are simultaneously formed in the outer peripheral portion of said metal member.

8. A method for producing a metal/ceramic bonding article as set forth in claim 7, wherein said stepped portion and fillet have a width of 0.05 to 0.5 mm and a thickness of 0.005 to 0.25 mm.

* * * * *